(12) United States Patent
Frolov et al.

(10) Patent No.: US 8,110,428 B2
(45) Date of Patent: Feb. 7, 2012

(54) THIN-FILM PHOTOVOLTAIC DEVICES

(75) Inventors: Sergey Frolov, Murray Hill, NJ (US); Allan James Bruce, Scotch Plains, NJ (US); Michael Cyrus, Summit, NJ (US)

(73) Assignee: Sunlight Photonics Inc., South Plainfield, NJ (US)

( * ) Notice: Subject to any disclaimer, the term of this patent is extended or adjusted under 35 U.S.C. 154(b) by 27 days.

(21) Appl. No.: 12/323,357

(22) Filed: Nov. 25, 2008

(65) Prior Publication Data

US 2010/0129957 A1 May 27, 2010

(51) Int. Cl.
*H01L 31/18* (2006.01)
(52) U.S. Cl. ............................... 438/95; 427/76
(58) Field of Classification Search .................. 438/57, 438/84, 85, 86, 95; 136/252, 256, 260, 262, 136/264, 265; 257/184, E31.007, E31.008, 257/E31.027; 427/76
See application file for complete search history.

(56) References Cited

U.S. PATENT DOCUMENTS

| | | | |
|---|---|---|---|
| 2,949,498 A | 8/1960 | Jackson | |
| 3,978,510 A | 8/1976 | Kasper et al. | |
| 4,094,704 A | 6/1978 | Milnes | |
| 4,181,256 A | 1/1980 | Kasagi | |
| 4,335,266 A | 6/1982 | Mickelsen et al. | |
| 4,338,480 A | 7/1982 | Antypas et al. | |
| 4,652,332 A | 3/1987 | Ciszek | |
| 4,686,323 A | 8/1987 | Biter et al. | |
| 4,740,386 A | 4/1988 | Cheung | |
| 4,798,660 A | 1/1989 | Ermer et al. | |
| 5,223,043 A | 6/1993 | Olsen et al. | |
| 5,282,993 A | 2/1994 | Karg | |
| 5,441,897 A | 8/1995 | Noufi et al. | |
| 5,445,847 A * | 8/1995 | Wada et al. | 427/74 |
| 5,567,469 A * | 10/1996 | Wada et al. | 427/74 |
| 5,626,688 A * | 5/1997 | Probst et al. | 136/265 |
| 5,985,691 A * | 11/1999 | Basol et al. | 438/95 |
| 6,107,562 A | 8/2000 | Hashimoto et al. | |
| 6,127,202 A | 10/2000 | Kapur et al. | |
| 6,258,620 B1 * | 7/2001 | Morel et al. | 438/57 |
| 6,340,789 B1 | 1/2002 | Petritsch et al. | |

(Continued)

FOREIGN PATENT DOCUMENTS

GB 2 400 725 A * 10/2004

(Continued)

OTHER PUBLICATIONS

Author Unknown, "Direct and indirect bandgaps", Wikipedia article, http://en.wikipedia.org/wiki/Direct_and _indirect_band_gaps[Sep. 10, 2011 6:20:01 PM].*

(Continued)

*Primary Examiner* — Mary Wilczewski
(74) *Attorney, Agent, or Firm* — Stuart H. Mayer; Mayer & Williams, P.C.

(57) ABSTRACT

A method is provided for producing a thin-film photovoltaic device. The method includes forming on a substrate a first thin-film absorber layer using a first deposition process. A second thin-film absorber layer is formed on the first thin-film absorber layer using a second deposition process different from the first deposition process. The first and second thin-film absorber layers are each photovoltaically active regions and the second thin-film absorber layer has a smaller concentration of defects than the first thin-film absorber layer.

13 Claims, 4 Drawing Sheets

U.S. PATENT DOCUMENTS

| | | | |
|---|---|---|---|
| 6,420,036 B1 | 7/2002 | Varaprasad et al. | |
| 6,534,704 B2 | 3/2003 | Hashimoto et al. | |
| 6,559,372 B2 | 5/2003 | Stanbery | |
| 6,974,976 B2 | 12/2005 | Hollars | |
| 7,026,258 B2 | 4/2006 | Taunier et al. | |
| 7,101,627 B2 | 9/2006 | MacDonald et al. | |
| 7,306,823 B2 | 12/2007 | Sager et al. | |
| 7,537,955 B2* | 5/2009 | Basol | 438/57 |
| 2002/0043279 A1* | 4/2002 | Karg | 136/262 |
| 2003/0234038 A1 | 12/2003 | Kurokami et al. | |
| 2004/0045598 A1 | 3/2004 | Narayanan et al. | |
| 2005/0056312 A1* | 3/2005 | Young et al. | 136/258 |
| 2005/0183768 A1 | 8/2005 | Roscheisen et al. | |
| 2005/0236032 A1* | 10/2005 | Aoki | 136/252 |
| 2005/0266600 A1* | 12/2005 | Basol | 438/63 |
| 2005/0271827 A1* | 12/2005 | Krunks et al. | 427/446 |
| 2006/0210640 A1 | 9/2006 | Kerkhof | |
| 2008/0041532 A1 | 2/2008 | Chou et al. | |
| 2008/0057203 A1* | 3/2008 | Robinson et al. | 427/337 |
| 2008/0057616 A1* | 3/2008 | Robinson et al. | 438/95 |
| 2008/0121277 A1* | 5/2008 | Robinson et al. | 136/256 |
| 2008/0124831 A1* | 5/2008 | Robinson et al. | 438/84 |
| 2008/0175982 A1* | 7/2008 | Robinson et al. | 427/74 |
| 2008/0196760 A1 | 8/2008 | Hayes et al. | |
| 2008/0226270 A1 | 9/2008 | Wendt et al. | |
| 2008/0280030 A1* | 11/2008 | Van Duren et al. | 427/74 |
| 2009/0107550 A1* | 4/2009 | Van Duren et al. | 136/262 |
| 2009/0162969 A1* | 6/2009 | Basol | 438/95 |
| 2009/0229666 A1* | 9/2009 | Corneille et al. | 136/262 |
| 2009/0250105 A1* | 10/2009 | Lee | 136/256 |
| 2010/0029036 A1* | 2/2010 | Robinson et al. | 438/93 |
| 2010/0129957 A1* | 5/2010 | Frolov et al. | 438/95 |
| 2010/0140101 A1* | 6/2010 | Aksu et al. | 205/157 |
| 2010/0180935 A1* | 7/2010 | Chen | 136/255 |
| 2010/0184249 A1* | 7/2010 | Chen | 438/72 |
| 2011/0039366 A1* | 2/2011 | Basol et al. | 438/62 |

FOREIGN PATENT DOCUMENTS

| | | |
|---|---|---|
| JP | 57153478 | 9/1982 |
| JP | 9326499 | 12/1997 |
| JP | 2001308354 | 11/2001 |
| JP | 2004103834 | 4/2004 |
| JP | 2004-296615 | 10/2004 |
| JP | 2006024574 | 1/2006 |
| JP | 2006-245507 | 9/2006 |
| JP | 2007096031 | 4/2007 |
| KR | 100246712 | 3/2000 |
| KR | 10-2008-0003624 | 1/2008 |
| WO | WO 2010/138635 | * 12/2010 |

OTHER PUBLICATIONS

Roecher, R., "Spray Technology", Brochure D03, Southwest Research Institute, 1998, 4 pages.

Eberspacher, C. et al., "Thin-film CIS alloy PV materials fabricated using non-vacuum, particles-based techniques," Thin Solid Films 387 (2001), pp. 18-22.

P.K. Johnson et al., "Comparative Study of Defect States in evaporated and Selenized CIGS(S) Solar Cells", Publication date unknown, but prior to Apr. 2, 2008, pp. 1-17.

Gregory M. Hanket et al., "Groth of Cu(InGA)(SeS)2 by the Reaction of CU-ga-In Precursors in H2Se and H2S", University of Delaware, Institute of Energy Conservation, publication date unknown, but prior to the Apr. 2, 2008, 2 pages.

T. Pisarkiewicz et al., "Fabrication of thin film polycrystalline CIS photovaltaic hetrostructure", Opto-Electron. Rev., vol. 11, No. 4, (2003), pp. 297-304.

Rommel Noufi and Ken Zweibel, "High-Efficiency CDTE and CIGS Thin-Film Solar Cells: Highlights and Challenges", National Renewable Energy Laboratory, Golden, CO., Publication date unknown, but prior to Apr. 2, 2008, 4 pages.

B. von Roedern et al., "Polycrystalline Thin-Film Photovoltaics: From the Laboratory to Solar Fields", May 2006, National Renewable Energy Laboratory, Golden, CO., pp. 1-4.

M. Raja Reddy, "Thin film solar cells for low cost space applications", European Space Agency, Dec. 1998, pp. 2-41.

Peter T. Erslev et al., "Study of the Electronic Properties of Matched Na-containing and Na-free CIGS Samples Using Junction Capacitance Methods", Publication date unknown, but prior to Apr. 2, 2008, 6 pages.

D. Bremaud et al., "Towards the Development of Flexible CIGS Solar Cells on Polymer Films with Efficiency Exceeding 15%", Publication date unknown, but prior to Apr. 2, 2008, 4 pages.

* cited by examiner

THIN-FILM PHOTOVOLTAIC DEVICES

BACKGROUND

1. Field

The present invention relates generally to a method of manufacturing thin-film photovoltaic devices, and particularly to a method for the manufacturing of high-efficiency thin-film photovoltaic devices.

2. Related Art

Photovoltaic (PV) devices represent one of the major sources of environmentally clean and renewable energy. They are frequently used to convert optical energy into electrical energy. Typically, a PV device is made of one or more semiconducting materials with p-doped and n-doped regions. The conversion efficiency of solar power into electricity of this device is limited to an absolute theoretical maximum of about 37%, since photon energy in excess of the semiconductor's bandgap is wasted as heat. In practice, PV devices with a single p-n junction may achieve a maximum efficiency of 25%. Currently, efficiencies of the best commercially available PV cells do not exceed 22%.

A number of different photovoltaic (PV) technologies have been developed in the last several decades. Most of these technologies may be divided into two large groups: one that is based on crystalline semiconductors and the other one that is based on polycrystalline and amorphous materials. The first group is largely based on semiconductors, such as silicon (Si), germanium (Ge) and gallium-arsenide (GaAs) that are grown on special, high quality, expensive substrates. The second group has a more diverse material base, which includes different forms of Si, Ge and their alloys, compound semiconductors such as cadmium-telluride (CdTe), copper-indium-selenium (CIS) and copper-indium-gallium-selenium (CIGS), organic molecular and polymeric semiconductors and others. These materials are typically deposited as thin films with thickness in the range of 1-10 µm, using a variety of methods and low-cost substrates. Thus, this latter group of PV technologies is often referred to as thin-film technologies.

The main attraction of thin-film PV is its relatively low cost of manufacturing. However, thin-film PV devices are not as efficient as crystalline PV devices. For example, average efficiencies of a-Si, CdTe, and CIGS PV modules are about 10% or less. On the other hand, the average efficiencies of c-Si modules are greater than 15%. In spite of relatively lower efficiency, thin-film PV technologies are capable of achieving lower cost per Watt (power in Watts produced by a PV cell) and therefore much shorter payback time. As a result, such technologies are gaining popularity and represent the fastest growing segment in the current PV market. Strong efforts are now under way to improve the performance of thin film PV devices in order to achieve efficiencies close to those demonstrated by crystalline PV devices.

SUMMARY

In accordance with the present invention, a method is provided for producing a thin-film photovoltaic device. The method includes forming on a substrate a first thin-film absorber layer using a first deposition process. A second thin-film absorber layer is formed on the first thin-film absorber layer using a second deposition process different from the first deposition process. The first and second thin-film absorber layers are each photovoltaically active regions and the second thin-film absorber layer has a smaller concentration of defects than the first thin-film absorber layer.

In accordance with one aspect of the invention, a thin-film photovoltaic device is formed in accordance with the aforementioned method.

In accordance with another aspect of the invention, a window layer is in contact with the second absorber layer.

In accordance with another aspect of the invention, a back contact layer is in contact with the first absorber layer.

In accordance with another aspect of the invention, a front contact layer is in contact with the window layer.

In accordance with another aspect of the invention, the substrate is in contact with the back contact layer.

In accordance with another aspect of the invention, the first thin-film absorber layer has p-type conductivity.

In accordance with another aspect of the invention, the second thin-film absorber layer has p-type conductivity.

In accordance with another aspect of the invention, the first thin-film absorber layer comprises a CIGS layer.

In accordance with another aspect of the invention, the second thin-film absorber layer comprises a CIGS layer.

In accordance with another aspect of the invention, the first deposition process is a reacted particle deposition process.

In accordance with another aspect of the invention, the second deposition process is a reacted target physical deposition process.

In accordance with another aspect of the invention, the second deposition process is a multi-elemental co-evaporation process.

In accordance with another aspect of the invention, the second thin-film absorber layer comprises at least two second absorber layers.

In accordance with another aspect of the invention, the second absorber layers has p-type conductivity and another other one of the second absorber layer has n-type conductivity.

In accordance with another aspect of the invention, at least one of the first and second thin-film absorber layers are greater than 10 nm in thickness.

In accordance with another aspect of the invention, at least one of the first and second deposition processes comprises deposition of CIGS.

In accordance with another aspect of the invention, the first deposition process is a reacted particle deposition process In accordance with another aspect of the invention, the second deposition process is a reacted target physical deposition process.

In accordance with another aspect of the invention, the second deposition is a co-evaporation deposition process.

In accordance with another aspect of the invention, at least one surface treatment step is performed following said first deposition process.

In accordance with another aspect of the invention, the second thin-film absorber layer is chemically doped step following the second deposition process.

In accordance with another aspect of the invention, a method is provided for producing a thin-film photovoltaic device. The method begins by forming on a substrate a first thin-film absorber layer using a first deposition process. A second thin-film absorber layer is formed on the first thin-film absorber layer using a second deposition process different from the first deposition process. The first and second thin-film absorber layers are each photovoltaically active regions.

DETAILED DESCRIPTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

Among current thin-film photovoltaic (PV) technologies, those based on a-Si, CdTe and CIGS have been commercialized and demonstrated energy conversion efficiencies greater than 10%. Single junction solar cells produced in a lab using CdTe and CIGS films have achieved 16.5% and 20% efficiencies, respectively. In comparison, efficiencies of commercial thin-film cells do not exceed 13% at the moment. This performance gap represents an opportunity and a future technology roadmap for PV developers. Thin-film PV manufacturers have to face a dilemma today in determining where to focus their efforts: whether it's improving cell efficiencies or lowering manufacturing costs. Usually, there is a trade-off between the two choices, so that one aspect of the technology cannot be improved without affecting the other. This invention addresses such a trade-off and in some cases provides a method of achieving both goals at the same time.

Although applicable to other materials, this invention and its specific approaches are provided here with a particular emphasis on CIS and CIGS materials. Provided methods, approaches and designs could be modified and adjusted to achieve similar results using different thin-film materials. Furthermore, it is understood that CIS and CIGS materials may be used interchangeably in the examples provided below, so that for example CIS may be replaced by CIGS by substituting In with $In_{1-x}Ga_x$ in order to increase the absorber semiconductor bandgap and achieve better performance.

Figure 1:
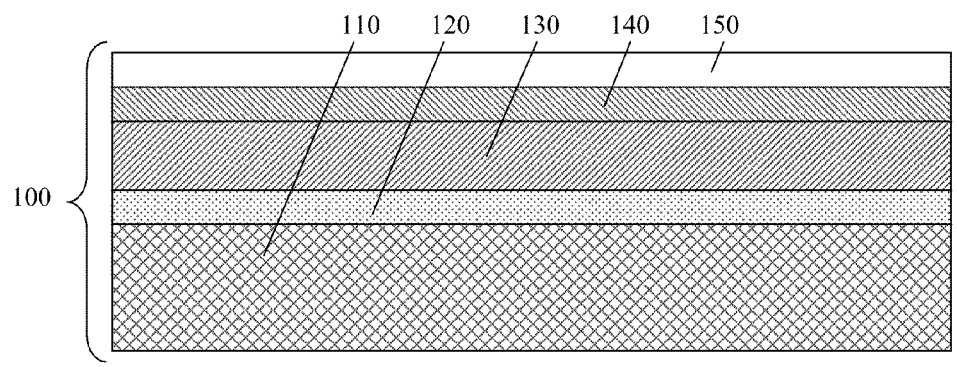
FIG. 1 is a cross-sectional view of a CIS hetero-junction cell.

A typical CIS cell 100 contains several layers as shown in FIG. 1: substrate 110, back contact layer 120, CIS layer 130, window layer 140 and front contact layer 150. Substrate 110 may be soda lime glass, stainless steel, polyimide or other film. Back contact 120 is typically a molybdenum (Mo) layer, whereas front contact 150 is made of a transparent conducting oxide (TCO), such as indium tin oxide (ITO) or doped zinc oxide (ZnO). Window layer 140 may include one or more layers of cadmium-sulfide (CdS), zinc-sulfide (ZnS), zinc oxide (ZnO) and other large bandgap semiconductors. Performance of CIS cells is influenced by all materials involved in the cell manufacturing, but to large extent determined by the quality of CIS layer 130.

Several methods of CIS deposition have been proposed and developed to a level of large scale manufacturing. One of the popular methods of large scale CIS manufacturing as described in U.S. Pat. No. 4,798,660 is a so-called 2-step deposition process consisting of (1) deposition of precursor layers and (2) chemical reaction of selenization resulting in a formation of a thin CIS layer. Other CIS manufacturing methods include co-evaporation technique as described in U.S. Pat. No. 4,335,266, field-assisted simultaneous synthesis and transfer process as described in U.S. Pat. No. 6,559,372, co-sputtering method as described in U.S. Pat. No. 6,974,976, and others. These CIS deposition methods have been primarily focused on the lowering of manufacturing costs at the expense of CIS film quality.

Figure 2:
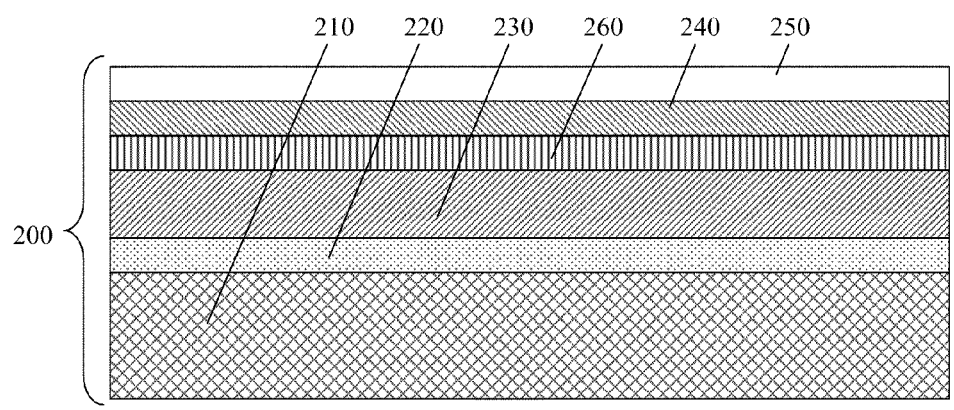
FIG. 2 is a cross-sectional view of a CIS homo-junction cell.

Prior and current manufacturing methods of CIS cells have primarily followed the design of CIS cell 100 shown in FIG. 1. In this design, a PV cell functions as a p-n heterojunction, in which p-type semiconductor is CIS layer 130 and n-type semiconductor is window layer 140. Alternatively, a p-n homojunction cell design has been proposed, as described in U.S. Pat. No. 6,107,562, and shown in FIG. 2. In this case CIS cell 200 includes substrate 210, back contact layer 220, p-type CIS layer 230, n-type CIS layer 260, window layer 240 and front contact layer 250. In manufacturing of such a cell, the CIS layer is actually deposited first as a single p-type layer, and subsequently, its top portion is converted into n-type layer 260 by doping with Cd, Zn or other appropriate dopant.

The performance of a PV cell is governed by various carrier recombination processes, but predominantly non-radiative recombination processes. Thin-film PV cells and specifically CIS cells are also particularly sensitive to interface recombination and recombination that occurs in the vicinity of interfaces between different layers. For example, in the case of CIS cell 100, its conversion efficiency would be particularly limited by the carrier recombination near the interface between CIS layer 130 and window layer 140. Similarly, in the case of CIS cell 200, its conversion efficiency would be particularly limited by the carrier recombination near the interfaces between p-type CIS layer 230, n-type CIS layer 260 and window layer 240. This carrier recombination process is commonly described by the Shockley-Read-Hall model, which stipulates that all recombination paths involve interband defect sites. Thus, a higher concentration of defects with interband states typically leads to a higher recombination rate.

In general, defects in a crystalline structure are due to local deviations from a stoichiometric material composition. In the case of CIS and CIGS semiconductor compounds, typical defects include but not limited to selenium vacancies ($V_{Se}$), copper vacancies ($V_{Cu}$), indium-on-copper antisites ($In_{Cu}$), gallium-on-copper antisites ($Ga_{Cu}$) and their complexes (e.g. $V_{Se}$-$V_{Cu}$). These defects, especially $V_{Se}$ and $V_{Cu}$, may be very detrimental to CIS cell performance; their presence in the CIS film restricts its photovoltaic efficiency. As a rule, thin films with material composition close to stoichiometric tend to have fewer defects. Thus different manufacturing processes produce different amounts of characteristic defects, depending on the resulting film composition, morphology and details of a corresponding deposition process. Typically, a CIS films produced using a low-cost manufacturing process in a large scale production line would have much more defects than a CIS film produced using a small scale process in a research lab. For example, U.S. Pat. No. 5,441,897 describes a co-evaporation process specifically designed to achieve the highest possible conversion efficiency in a CIS cell. Although such a process does not fall into the category of low-cost manufacturing processes, it achieves better CIS film quality with more accurately controlled chemical composition and stoichiometry, which results in fewer defects and subsequently higher cell conversion efficiency.

Figure 3:
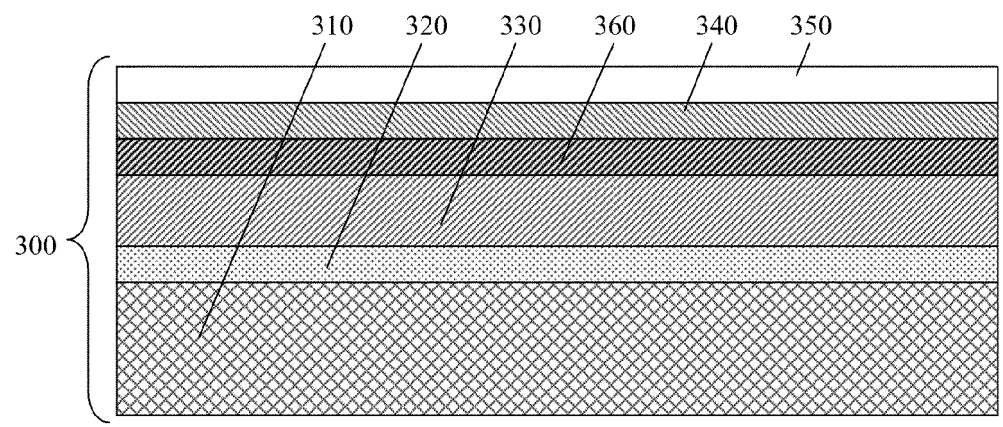
FIG. 3 is a cross-sectional view of a multi-layer CIS cell constructed in accordance with the present invention.

This invention provides a new approach to CIS cell design and manufacturing. FIG. 3 shows a design of new multi-layer CIS cell 300, which includes substrate 310, back contact layer 320, p-type CIS layer 330, p-type CIS layer 360, window layer 340 and front contact layer 350. Such a cell may be manufactured, so that CIS layer 330 is first produced by the first deposition process and then CIS layer 360 is produced by the second deposition process. The first CIS deposition process is a low-cost deposition process, e.g. a 2-stage deposition process. The second CIS deposition process is a higher cost deposition process, e.g. a co-evaporation process, which provides superior CIS film quality. Other layers in CIS cell 300 may be produced using standard deposition techniques used in the production of CIS cell 100.

Both CIS film deposition processes may be defined and distinguished by a number of their characteristic features: (1) general deposition method (e.g. 2-stage deposition vs. co-evaporation), (2) a particular variant of the method (e.g. using metal precursors vs. their oxides in the 2-stage deposition), (3) particular apparatus or tools used in the process (e.g. an RF magnetron sputterer vs. an ink-jet printer), (4) particular set of processing parameters used to control the deposition process (e.g. pressure, temperature, time etc.), (5) diagnostic tools for monitoring processing parameters (such as pressure gauges, deposition rate sensors, mass spectrometers, etc.) and (6) others. In general, CIS film quality may be affected by changing any of the listed characteristic features. Therefore, different quality films may be produced by varying any of the above process characteristics (1) through (6). The most dramatic change in the film quality is expected to occur by changing (1) the general deposition method. There is a wide-ranging spectrum of different CIS deposition methods such as very low-cost manufacturing processes on one end of the spectrum, such as ink-based deposition, to very high-cost manufacturing processes on the other end of the spectrum, such as elemental co-evaporation methods. It is typical that a higher cost deposition step results in a higher quality CIS film.

Figure 8:
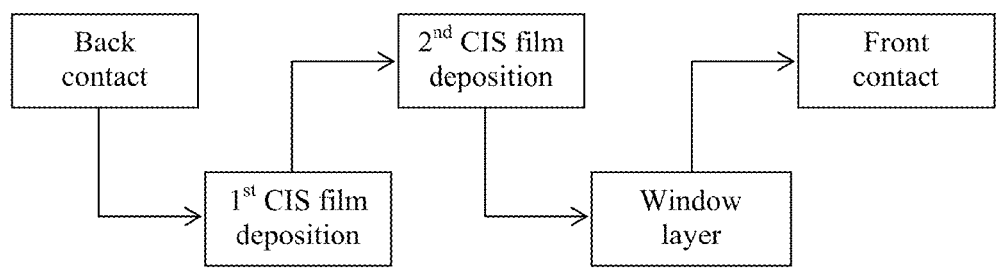
FIG. 8 shows a sequence of processing steps for producing an improved multi-layer CIS cell.

Each of the two deposition processes that are employed in the fabrication of the multi-layer cell 300 may result in the formation of a functioning and photovoltaically active semiconductor thin film, even if produced as a stand-alone film. This implies that both CIS films have to be substantially thick (thicker than many atomic layers, e.g. 10 nm) and have a chemical composition and crystalline structure (e.g. that of polycrystalline chalcopyrite $CuInSe_2$) appropriate for a photovoltaically active semiconductor thin film. Each CIS deposition process may in turn consist of several different smaller steps or stages; for example, a 2-stage CIS deposition is accomplished by first depositing metal precursor layers and then performing a subsequent selenization step. Also, each CIS deposition process, in general, need not depend on each other, although additional preparatory processing steps may be performed between the first and the second CIS depositions processes In another aspect of this invention, a multi-step process is provided to produce an improved PV cell comprised of at least two CIS layers. FIG. 8 shows the important steps in such a process, including back contact deposition, $1^{st}$ CIS layer deposition, $2^{nd}$ layer deposition, window layer deposition and front contact layer deposition. Additional processing steps may be included, such as substrate preparation, cleaning, surface treatments and others. This process may also be adapted to deposition of other thin-film absorber materials and production of PV cells based on such materials (e.g. CdTe-based alloys, SiGe alloys, a-Si etc.).

In CIS cell 300, the film quality in the vicinity of p-n junction, i.e. the interface between CIS layer 360 and window layer 340, is relatively high, since the top portion of the film is produced by a superior manufacturing process. Therefore, interface recombination may be dramatically reduced and consequently, CIS cell performance may be improved. The thickness of CIS layer 360 may be small relative to the thickness of CIS layer 330, so that this high-cost manufacturing step does not contribute significantly to the overall manufacturing cost of CIS cell 300. Instead, the addition of a second, relatively thin and higher-quality CIS film results in substantial improvement in the performance and efficiency, which more than compensates for any incremental increases in the manufacturing cost that arises from the use of two processes instead of one.

As a result of one aspect of conventional CIS and CIGS film processing techniques, conventional CIGS cells with semiconductor compositions (e.g., compositions containing larger fractions of Ga, Al or S) that produce bandgaps larger than about 1.2-1.3 eV are much less efficient in comparison with the theoretical values. This in part is due to difficulties in achieving good crystalline quality in these films, which gives rise to increased interface recombination. Thus, the methods disclosed herein may be particularly effective for producing CIGS cells having larger absorber semiconductor bandgaps.

Figure 4:
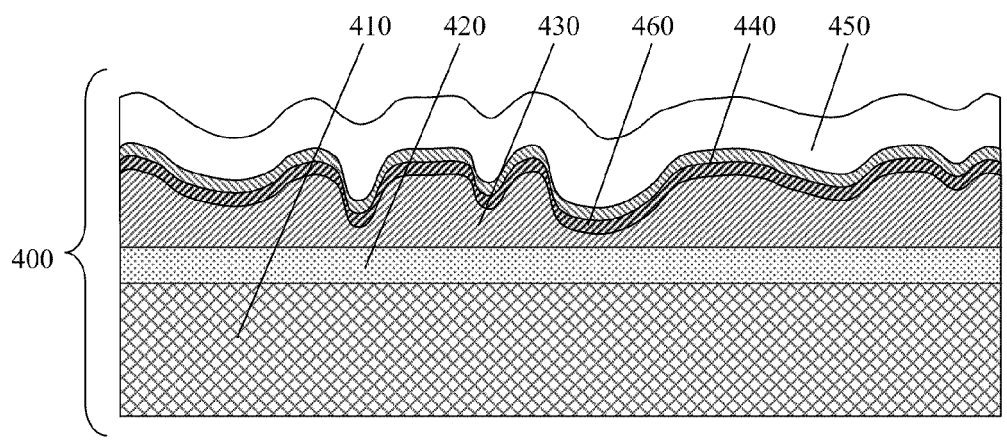
FIG. 4 is a cross-sectional view of a non-uniform multi-layer CIS cell.

As a result of yet another aspect of thin-film processing techniques, a typical conventional CIS film is not uniform, i.e. its thickness varies across the film's area due to non-uniform deposition. The degree of uniformity generally varies from process to process. The methods described herein may also improve CIS cell performance by improving CIS film uniformity, as will be illustrated with reference to FIG. 4. FIG. 4 shows a non-uniform CIS cell 400 that includes substrate 410, back contact layer 420, p-type CIS layer 430, p-type CIS layer 460, window layer 440 and front contact layer 450. The non-uniformity is mainly caused by the CIS layer 430 that is deposited using a low-cost deposition process. The non-uniformity may cause the formation of voids, pin holes and micro-cracks, which in turn may short the cell. As result, the CIS layer thickness in a typical CIS cell, such as cell 100, is typically chosen to be in the range of 2-3 μm so that its non-uniformity does not severely affect the CIS cell performance. However, the theoretical optimum thickness of CIS layer is in the range of 1-1.5 μm, indicating that about 50% of CIS material in a typical PV cell may be wasted. The deposition of the second CIS layer 460, as shown in FIG. 4, when performed by a more conformal and uniform deposition process, may cover and eliminate the defects and electrical shorts caused by non-uniformity of the first CIS layer 430. Such an approach may enable the use of overall thinner CIS layers in photovoltaic cell manufacturing, thereby reducing the cost of CIS deposition by about 50% or even more.

EXAMPLES

In one embodiment of the invention, CIS cell 300 may be produced on soda-lime glass substrate 310. First, a 0.5-2 μm thick layer of Mo may be deposited, e.g. by sputtering, to produce back contact layer 320. Second, a 0.5-3 μm thick layer of CIS may be deposited, e.g. by low-cost sputtering and selenization processes, to produce the first CIS layer 330.

This layer may have p-type electrical conductivity. It also may be functional and photovoltaically active. Third, another 0.01-1 μm thick layer of CIS may be deposited, e.g. by higher cost co-evaporation processes, to produce the second CIS layer 360. It may be preferred that the second CIS deposition process does not significantly adversely affect the structure and properties of the first CIS layer 330, e.g. due to interdiffusion. Fourth, a 50-200 nm thick CdS layer is deposited, e.g. using chemical bath deposition (CBD), to produce window layer 340. Fifth, a 0.5-2 μm thick Al-doped ZnO layer is deposited, e.g. by sputtering, to produce transparent front contact layer 350. In addition, contact metal grids may be deposited on top of contact layer 350, e.g. using ~1 μm thick Ni/Al metal stack.

In another embodiment, CIS semiconductor may be replaced by CIGS semiconductor, the bandgap of which may be engineered by varying the ratio between In and Ga content. For example, at Ga content of 30 at. % CIGS has a bandgap of 1.15 eV. Alternatively, a CIGS compound may be alloyed with Al, S and Te to further improve flexibility in the compositional design of CIGS materials and increase the range of available bandgaps. The two CIGS layers of cell 300 may have a nearly identical chemical composition, differing primarily in their quality and defect concentrations. Alternatively, these CIGS layers may have different chemical compositions, but the same bandgap. Also, these CIGS layers may have different chemical compositions and different bandgaps, e.g. $CuInSe_2$ and $CuIn_{0.7}Ga_{0.3}Se_2$.

In another embodiment, the first and second CIS layers may be deposited using similar deposition processes, differing either in deposition equipment or processing parameters. The second CIS film quality may be improved by using better equipment or varying deposition parameters, such as pressure, temperature, deposition rate etc.

In another embodiment, the second CIS layer may be in turn comprised of at least two CIS layers produced in separate deposition steps.

In another embodiment, in addition to the first deposition of the first CIS layer and the second deposition of the second CIS layer, there may be additional preparatory processing steps, either before or after CIS film depositions. For, example the first CIS film may chemically treated or etched, for example in NaCN or KCN, to improve the film or its surface, before the second deposition of the second CIS film.

In another embodiment, at least one of the CIS layers is deposited using reacted particle deposition (RPD) method, as described in co-pending application Ser. No. 12/185,369, entitled "A Reacted Particle Deposition (RPD) Method for Forming a Compound Semi-Conductor Thin-film," which is hereby incorporated by reference in its entirety. At least one of the CIS layers may be the first CIS layer 330. RPD is a deposition method intended for a large area roll-to-roll coating process. It is similar to ink-jet printing processes and may be especially suited for deposition of low-cost CIS films.

In another embodiment, at least one of the CIS layers is deposited using reacted target physical deposition (RTPD) method, as described in co-pending application Ser. No. 12/061,450, entitled "A Method for Forming a Compound Semi-Conductor Thin-film," which is hereby incorporated by reference in its entirety. At least one of the CIS layers may be the second CIS layer 360. RTPD is a deposition process in which the composition of a deposited film is controlled rigidly and remains very close to that of a target. Vacuum-based RTPD is a relatively high cost process and may produce very high quality CIS films.

Figure 5:
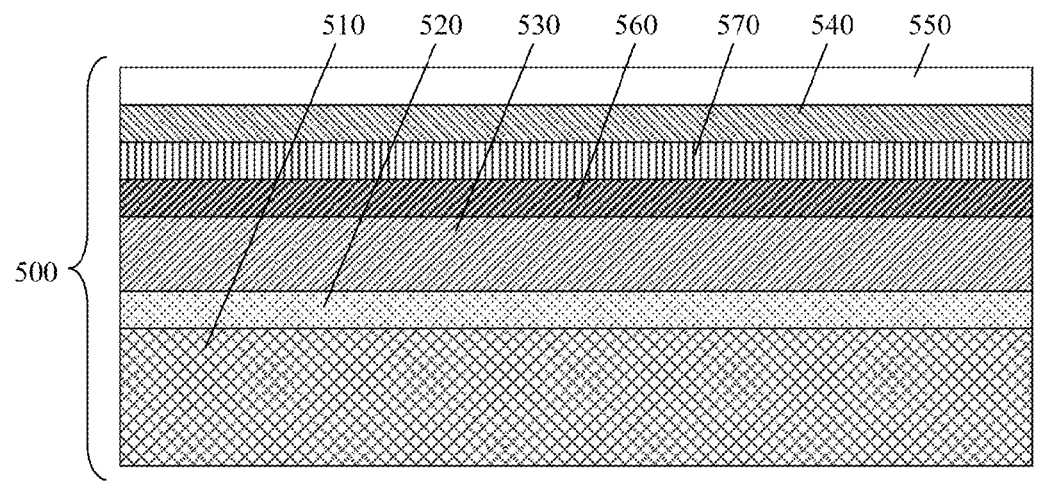
FIG. 5 is a cross-sectional view of a multi-layer CIS homo-junction cell constructed in accordance with the present invention.

In another embodiment shown in FIG. 5, CIS cell 500 includes substrate 510, back contact layer 520, p-type CIS layer 530, p-type CIS layer 560, n-type CIS layer 570, window layer 540 and front contact layer 550. P-type CIS layer 560 and n-type CIS layer 570 may be deposited in separate deposition step. Alternatively, CIS layer 560 and CIS layer 570 may be first deposited as a single p-type CIS layer, followed by a chemical doping step, e.g. in Cd or Zn-containing chemical bath, resulting in a formation of a third n-type CIS layer. In this case, p-type CIS layer 530 may be about 2 μm thick, p-type CIS layer 560 may be about 50 nm thick, and n-type CIS layer 570 may be about 30 nm thick.

Figure 6:
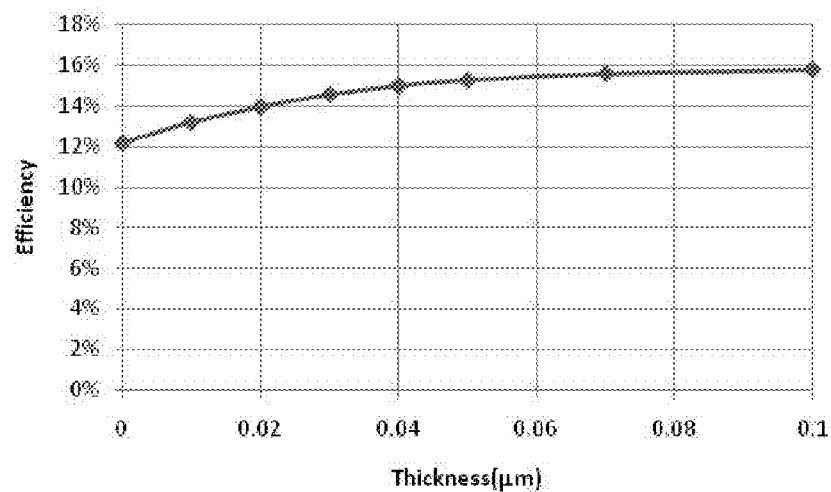
FIG. 6 is plot of two-layer CIS cell efficiency vs. second CIS layer thickness.
Figure 7:
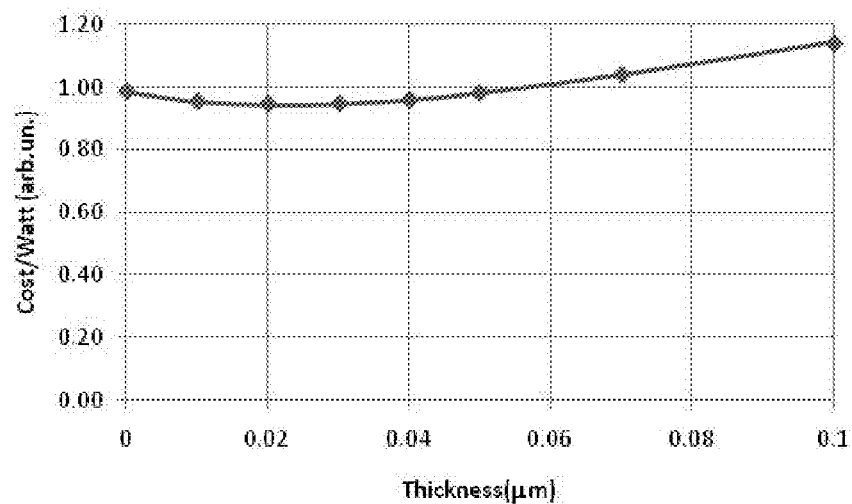
FIG. 7 is plot of two-layer CIS cell cost per Watt vs. second CIS layer thickness.

Performance of CIS cell 300 has been simulated using semiconductor simulation software "AMPS-1D" provided by Pennsylvania State University. In this case, back contact 320 was a Mo layer and front contact layer 350 was Al-doped ZnO layer. Window layer 340 consisted of 30 nm thick CdS layer and 55 nm thick ZnO layer. P-type CIS layer 330 was 2000 nm thick, whereas p-type CIS layer 360 thickness was varied from 0 to 100 nm. The primary difference between CIS layers 330 and 360 was the interband defect concentration: CIS layer 330 was characterized by acceptor- and donor-like defect concentrations of $5 \cdot 10^{16}$ cm$^{-3}$, whereas CIS layer 360 was characterized by acceptor- and donor-like defect concentrations of $1 \cdot 10^{15}$ cm$^{-3}$. FIG. 6 shows that deposition of thin higher quality CIS film on top of a thicker lower quality CIS film may significantly improve the overall efficiency of the CIS cell from about 12% to nearly 16% in the range of the second CIS film thicknesses between 0 and 100 nm. Furthermore, we assumed that the second deposition process is about 10 times more expensive than the first deposition process. FIG. 7 shows the total manufacturing cost per Watt of the new two-layer CIS film, illustrating that for example using 40 nm thick second CIS film the cost per Watt may be reduced by 5%, while the efficiency may be increased by 25%. Due to increased efficiency, the effective manufacturing cost may be lowered in spite of the introduction of a higher cost second CIS deposition process.

Variations of the apparatus and method described above are possible without departing from the scope of the invention.

What is claimed is:

1. A method of producing a thin-film photovoltaic device, comprising:
   forming on a substrate a first thin-film absorber layer using a first deposition process; and
   forming on the first thin-film absorber layer a second thin-film absorber layer using a second deposition process different from the first deposition process, wherein said second thin-film absorber layer has a smaller concentration of defects than the first thin-film absorber layer, and wherein the first and second thin-film absorber layers are each photovoltaically active regions, one of the first or second deposition processes being selected from the group consisting of a reacted particle deposition process, a reacted target deposition process and a co-evaporation deposition process.

2. The method of claim 1, wherein at least one of the first and second deposition processes comprises deposition of CIGS.

3. The method of claim 1, wherein said first deposition process is a reacted particle deposition process.

4. The method of claim 1, wherein said second deposition process is a reacted target physical deposition process.

5. The method of claim 1, wherein said second deposition is a co-evaporation deposition process.

6. The method of claim 1, further comprising performing at least one surface treatment step following said first deposition process.

7. The method of claim 1, further comprising chemically doping the second thin-film absorber layer step following said second deposition process.

8. The method of claim 1, wherein said second thin-film absorber layer has a slower recombination rate than the first thin-film absorber layer.

9. The method of claim 1, wherein said first and second thin-film absorber layers have essentially the same chemical composition and optical bandgap.

10. A method of producing a thin-film photovoltaic device, comprising:
    forming on a substrate a first thin-film absorber layer using a first deposition process; and
    forming on the first thin-film absorber layer a second thin-film absorber layer using a second deposition process different from the first deposition process, wherein said second thin-film absorber layer has a slower recombination rate than the first thin-film absorber layer, and wherein the first and second thin-film absorber layers are each photovoltaically active regions, wherein said second deposition process is a reacted target physical deposition process.

11. The method of claim 10, wherein said first deposition process is a reacted particle deposition process.

12. A method of producing a thin-film photovoltaic device, comprising:
    forming on a substrate a first thin-film absorber layer using a first deposition process; and
    forming on the first thin-film absorber layer a second thin-film absorber layer using a second deposition process different from the first deposition process, wherein said first and second thin-film absorber layers have essentially the same chemical composition and optical bandgap, and wherein the first and second thin-film absorber layers are each photovoltaically active regions, wherein said second deposition process is a reacted target physical deposition process.

13. The method of claim 12, wherein said first deposition process is a reacted particle deposition process.

* * * * *